United States Patent
Shamarao et al.

(10) Patent No.: US 10,367,662 B1
(45) Date of Patent: Jul. 30, 2019

(54) METHOD AND APPARATUS FOR NOVEL ADAPTIVE EQUALIZATION TECHNIQUE FOR SERIALIZER/DESERIALIZER LINKS

(71) Applicant: Integrated Device Technology, Inc., San Jose, CA (US)

(72) Inventors: Prashant Shamarao, Johns Creek, GA (US); Yonggang Chen, Duluth, GA (US); Brad Luis, Chapel Hill, NC (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/650,824

(22) Filed: Jul. 14, 2017

Related U.S. Application Data

(62) Division of application No. 12/976,853, filed on Dec. 22, 2010, now Pat. No. 10,063,397.

(51) Int. Cl.
*H04L 25/04* (2006.01)
*H04L 27/22* (2006.01)
*H04L 25/03* (2006.01)

(52) U.S. Cl.
CPC .............................. *H04L 25/03057* (2013.01)

(58) Field of Classification Search
CPC .......... H04L 25/03885; H04L 25/0296; H04L 25/061; H04L 1/205; H04L 25/03057; H04L 25/03019; H04L 7/0004; H04B 3/143
See application file for complete search history.

(56) References Cited

U.S. PATENT DOCUMENTS

| | | | | |
|---|---|---|---|---|
| 7,668,233 B2* | 2/2010 | Bergmann | ............. | G01R 29/26 375/224 |
| 7,738,904 B1* | 6/2010 | Chien | .................... | H04W 52/52 455/522 |
| 9,001,943 B2* | 4/2015 | Hoang | .................... | H04L 25/03 375/345 |
| 2003/0228852 A1 | 12/2003 | Murakami et al. | | |
| 2004/0028158 A1 | 2/2004 | Fujimori et al. | | |
| 2005/0047500 A1* | 3/2005 | Gupta | ..................... | H03L 7/085 375/232 |
| 2005/0165585 A1 | 7/2005 | Bhateja et al. | | |
| 2005/0278589 A1* | 12/2005 | Ong | ........................ | H04L 1/205 714/55 |
| 2006/0006744 A1 | 1/2006 | Nashiki | | |
| 2006/0264192 A1* | 11/2006 | Kuo | .................... | H04W 52/367 455/232.1 |
| 2007/0041455 A1 | 2/2007 | Tran et al. | | |

(Continued)

OTHER PUBLICATIONS uA741 General-Purpose Operational Amplifiers, Data sheet SLOS094B—Nov. 1970—Revised Sep. 2000, Texas Instruments.

(Continued)

*Primary Examiner* — Aristocratis Fotakis
(74) *Attorney, Agent, or Firm* — Heimlich Law, PC; Alan Heimlich, Esq.

(57) ABSTRACT

A method and apparatus for a novel adaptive equalization technique for a Serializer/Deserializer receiver is disclosed. In one approach, adjustment of AC and DC gains is performed before DFE coefficients are adjusted. Further after the equalization an electrical idle threshold may be set based on the results of the equalization.

3 Claims, 13 Drawing Sheets

(56) References Cited

U.S. PATENT DOCUMENTS

| | | | |
|---|---|---|---|
| 2007/0237264 A1 | 10/2007 | Huang et al. | |
| 2007/0241821 A1* | 10/2007 | Dally | H03G 3/3036 |
| | | | 330/279 |
| 2007/0280341 A1* | 12/2007 | Hidaka | G01D 21/00 |
| | | | 375/229 |
| 2008/0151703 A1* | 6/2008 | Kim | G11B 20/10009 |
| | | | 369/30.11 |
| 2009/0154542 A1 | 6/2009 | Ding et al. | |
| 2010/0086017 A1 | 4/2010 | Shumarayev et al. | |
| 2010/0220243 A1 | 9/2010 | Chien et al. | |
| 2016/0308694 A1* | 10/2016 | Hoang | H04L 25/03 |

OTHER PUBLICATIONS

Silicon Labs Expands Automotive Portfolio with Automotive-Grade AM/FM Tuners, Nov. 8, 2010, High-Petformance Si475x Car Radio Tuner ICs Optimized for Demanding Yet Cost-Sensitive Head Unit Designs, Silicon Laboratories Inc.

Scha.um's Outline of Theory and Problems of Electric Circuits, Joseph A. Edminister, M.S.E., McGraw-Hill Book Company, Copyright © 1965.

Basic Electricy, Prepared by Bureau of Naval Personnel, Navy Training Course Navpers 10086-A, United States Government Printing Office Washington: 1960.

* cited by examiner

1000

```
The AC gains are reset to zero for a receiver
coupled to the SERDES link.
   The DC gains are reset to zero for the
receiver coupled to the SERDES link.
   A frequency of a signal is detected on the
SERDES link at the receiver.
   And when the frequency of the signal has
high frequency energy then the AC gains are
adjusted and
   when the frequency of the signal has low
frequency energy the DC gains are adjusted.
                                          1001
```

```
   The AC gains are reset to zero for a
receiver coupled to the SERDES link.
   The DC gains are reset to zero for the
receiver coupled to the SERDES link.
   A frequency of a signal is detected on the
SERDES link at the receiver.
   And when the frequency of the signal has
high frequency energy then the AC gains are
adjusted and
   when the frequency of the signal has low
frequency energy the DC gains are adjusted.
   Where adjusting the DC gains is adjusting
the DC gains until a DC limit is reached, the DC
limit selected from a maximum DC gain, a
minimum DC gain, or a predefined DC level for
the signal.
                                          1003
```

```
   The AC gains are reset to zero for a
receiver coupled to the SERDES link.
   The DC gains are reset to zero for the
receiver coupled to the SERDES link.
   A frequency of a signal is detected on the
SERDES link at the receiver.
   And when the frequency of the signal has
high frequency energy then the AC gains are
adjusted and when the frequency of the signal
has low frequency energy the DC gains are
adjusted.
   Where adjusting the AC gains is adjusting
the AC gains until an AC limit is reached, the
AC limit selected from a maximum AC gain, a
minimum AC gain, or a predefined AC level for
the signal.
                                          1002
```

```
The AC gains are reset to zero for a receiver
coupled to the SERDES link.
   The DC gains are reset to zero for the
receiver coupled to the SERDES link.
   A frequency of a signal is detected on the
SERDES link at the receiver.
   And when the frequency of the signal has
high frequency energy then the AC gains are
adjusted and
   when the frequency of the signal has low
frequency energy the DC gains are adjusted.
   Where adjusting the AC gains is adjusting
the AC gains until an AC limit is reached, the
AC limit selected from a maximum AC gain, a
minimum AC gain, or a predefined AC level for
the signal.
   Where adjusting the DC gains is adjusting
the DC gains until a DC limit is reached, the DC
limit selected from a maximum DC gain, a
minimum DC gain, or a predefined DC level for
the signal.
                                          1004
```

1005
The AC gains are reset to zero for a receiver coupled to the SERDES link.
The DC gains are reset to zero for the receiver coupled to the SERDES link.
A frequency of a signal is detected on the SERDES link at the receiver.
And when the frequency of the signal has high frequency energy then the AC gains are adjusted and when the frequency of the signal has low frequency energy the DC gains are adjusted.
Where adjusting the AC gains is adjusting the AC gains until an AC limit is reached, the AC limit selected from a maximum AC gain, a minimum AC gain, or a predefined AC level for the signal.
Where adjusting the DC gains is adjusting the DC gains until a DC limit is reached, the DC limit selected from a maximum DC gain, a minimum DC gain, or a predefined DC level for the signal.
And further adjusting one or more decision feedback equalization coefficients in an adaptive filter when the DC limit of maximum DC gain is reached.

1006
The AC gains are reset to zero for a receiver coupled to the SERDES link.
The DC gains are reset to zero for the receiver coupled to the SERDES link.
A frequency of a signal is detected on the SERDES link at the receiver.
And when the frequency of the signal has high frequency energy then the AC gains are adjusted and when the frequency of the signal has low frequency energy the DC gains are adjusted.
Where adjusting the AC gains is adjusting the AC gains until an AC limit is reached, the AC limit selected from a maximum AC gain, a minimum AC gain, or a predefined AC level for the signal.
Where adjusting the DC gains is adjusting the DC gains until a DC limit is reached, the DC limit selected from a maximum DC gain, a minimum DC gain, or a predefined DC level for the signal.
And further adjusting one or more decision feedback equalization coefficients in an adaptive filter when the DC limit of minimum DC gain is reached.

1007
The AC gains are reset to zero for a receiver coupled to the SERDES link.
The DC gains are reset to zero for the receiver coupled to the SERDES link.
A frequency of a signal is detected on the SERDES link at the receiver.
And when the frequency of the signal has high frequency energy then the AC gains are adjusted and when the frequency of the signal has low frequency energy the DC gains are adjusted.
Where adjusting the AC gains is adjusting the AC gains until an AC limit is reached, the AC limit selected from a maximum AC gain, a minimum AC gain, or a predefined AC level for the signal.
Where adjusting the DC gains is adjusting the DC gains until a DC limit is reached, the DC limit selected from a maximum DC gain, a minimum DC gain, or a predefined DC level for the signal.
And further adjusting one or more decision feedback equalization coefficients in an adaptive filter when the AC limit of maximum AC gain is reached.

The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the AC gain limit of minimum AC gain is reached.

1009

The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the DC limit of maximum DC gain is reached.

Where adjusting one or more decision feedback equalization coefficients in the adaptive filter increases the signal low frequency energy.

1010

The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the DC limit of minimum DC gain is reached.

The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the AC limit of maximum AC gain is reached.

Where adjusting one or more decision feedback equalization coefficients in the adaptive filter increases the signal high frequency energy.

---

1012

The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the AC gain limit of minimum AC gain is reached.

Where adjusting one or more decision feedback equalization coefficients in the adaptive filter decreases the signal high frequency energy.

---

1013

The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And when the predefined AC level for the signal is reached and when the predefined DC level for the signal is reached no further adjusting of the AC gains is performed and no further adjusting of the DC gains is performed.

The AC gains are reset to zero for a receiver coupled to the SERDES link.
The DC gains are reset to zero for the receiver coupled to the SERDES link.
A frequency of a signal is detected on the SERDES link at the receiver.
And when the frequency of the signal has high frequency energy then the AC gains are adjusted and when the frequency of the signal has low frequency energy the DC gains are adjusted.
Where adjusting the AC gains is adjusting the AC gains until an AC limit is reached, the AC limit selected from a maximum AC gain, a minimum AC gain, or a predefined AC level for the signal.
Where adjusting the DC gains is adjusting the DC gains until a DC limit is reached, the DC limit selected from a maximum DC gain, a minimum DC gain, or a predefined DC level for the signal.
And when the predefined AC level for the signal is reached and when the predefined DC level for the signal is reached no further adjusting of the AC gains is performed and no further adjusting of the DC gains is performed.
Where when no further adjusting of the AC gains is performed and no further adjusting of the DC gains is performed then adjusting an electrical idle signal threshold to a first predefined percentage of the predefined AC level for the signal and a second predefined percentage of the predefined DC level for the signal.

1014

--- means for resetting AC and DC gains in a receiver to zero;
means for resetting decision feedback equalization (DFE) coefficients in an adaptive filter;
means for detecting a frequency of a signal at the receiver;
means for adjusting the signal at the receiver to a predefined AC level by adjusting the AC gains and adjusting the DFE coefficients when the detected frequency in the signal is within 50 percent of a frequency of a clock; and
means for adjusting the signal at the receiver to a predefined DC level by adjusting the DC gains and adjusting the DFE coefficients when the detected frequency in the signal is below 50 percent of the frequency of the clock.

1015

--- means for resetting AC and DC gains in a receiver to zero;
means for resetting decision feedback equalization (DFE) coefficients in an adaptive filter;
means for detecting a frequency of a signal at the receiver;
means for adjusting the signal at the receiver to a predefined AC level by adjusting the AC gains and adjusting the DFE coefficients when the detected frequency in the signal is within 50 percent of a frequency of a clock; and
means for adjusting the signal at the receiver to a predefined DC level by adjusting the DC gains and adjusting the DFE coefficients when the detected frequency in the signal is below 50 percent of the frequency of the clock.
And where the AC gains have a range from zero AC gain to a maximum AC gain, and where the DC gains have a range from zero DC gain to a maximum DC gain, and where the adjusting the DFE coefficients occurs only when a limit is hit, the limit selected from the maximum AC gain, or the maximum DC gain.

1016

--- means for resetting AC and DC gains in a receiver to zero; means for resetting decision feedback equalization (DFE) coefficients in an adaptive filter; means for detecting a frequency of a signal at the receiver; means for adjusting the signal at the receiver to a predefined AC level by adjusting the AC gains and adjusting the DFE coefficients when the detected frequency in the signal is within 50 percent of a frequency of a clock; and means for adjusting the signal at the receiver to a predefined DC level by adjusting the DC gains and adjusting the DFE coefficients when the detected frequency in the signal is below 50 percent of the frequency of the clock. Where the AC gains have a range from zero AC gain to a maximum AC gain, and where the DC gains have a range from zero DC gain to a maximum DC gain, and where the adjusting the DFE coefficients occurs only when a limit is not hit, the limit selected from the maximum AC gain, or the maximum DC gain.

1018
(a) receiving at a serializer/deserializer receiver input a training signal pattern having a sequence of alternating bits and a sequence of three or more consecutive same bits;
(b) adjusting AC gains when the training signal pattern having the sequence of alternating bits is present until the training signal pattern is at a predefined AC signal level;
(c) adjusting DC gains when the training signal pattern having the sequence of three or more consecutive same bits is present until the training signal pattern is at a predefined DC signal level; and
(d) repeating sequence (b)-(c) until the training signal pattern ends.

1019
(a) receiving at a serializer/deserializer receiver input a training signal pattern having a sequence of alternating bits and a sequence of three or more consecutive same bits;
(b) adjusting AC gains when the training signal pattern having the sequence of alternating bits is present until the training signal pattern is at a predefined AC signal level;
(c) adjusting DC gains when the training signal pattern having the sequence of three or more consecutive same bits is present until the training signal pattern is at a predefined DC signal level;
(d) repeating sequence (b)-(c) until the training signal pattern ends;
and then
(e) adjusting decision feedback equalization coefficients in an adaptive filter.

1020
(a) receiving at a serializer/deserializer receiver input a training signal pattern having a sequence of alternating bits and a sequence of three or more consecutive same bits;
(b) adjusting AC gains when the training signal pattern having the sequence of alternating bits is present until the training signal pattern is at a predefined AC signal level;
(c) adjusting DC gains when the training signal pattern having the sequence of three or more consecutive same bits is present until the training signal pattern is at a predefined DC signal level;
(d) repeating sequence (b)-(c) until the training signal pattern ends; and then
(e) adjusting an electrical idle signal threshold to a predefined percentage of the predefined AC signal level and the predefined DC signal level.

1021
means for resetting AC and DC gains in a receiver to zero; means for resetting decision feedback equalization (DFE) coefficients in an adaptive filter; means for detecting a frequency of a signal at the receiver; means for adjusting the signal at the receiver to a predefined AC level by adjusting the AC gains and adjusting the DFE coefficients when the detected frequency in the signal is within 50 percent of a frequency of a clock; and means for adjusting the signal at the receiver to a predefined DC level by adjusting the DC gains and adjusting the DFE coefficients when the detected frequency in the signal is below 50 percent of the frequency of the clock.

FIG. 10F

METHOD AND APPARATUS FOR NOVEL ADAPTIVE EQUALIZATION TECHNIQUE FOR SERIALIZER/DESERIALIZER LINKS

RELATED APPLICATION

This patent application is a divisional of, and claims priority to, patent application Ser. No. 12/976,853 filed Dec. 22, 2010 titled "Method and Apparatus for Novel Adaptive Equalization Technique For Serializer/Deserializer Links", which is hereby incorporated herein by reference, and which has issued on Aug. 28, 2018 as U.S. Pat. No. 10,063,397 B1 titled "Method and Apparatus for Novel Adaptive Equalization Technique For Serializer/Deserializer Links", which is hereby incorporated herein by reference.

FIELD OF THE INVENTION

The present invention pertains to Serializer/Deserializer (SERDES or SerDes) Links. More particularly, the present invention relates to a method and apparatus for novel adaptive equalization technique for Serializer/Deserializer links.

BACKGROUND OF THE INVENTION

Serializer/Deserializer (SERDES or SerDes) links are used in variety of applications. For example, one use of SerDes is in high speed communications. In such a high speed environment, the communications channel is not ideal and equalization may be required to compensate for channel characteristics, such as, but not limited to offset, distortion, losses, etc. Without equalization performance may not be optimum, reliable, etc. This presents a problem.

BRIEF DESCRIPTION OF THE DRAWINGS

The invention is illustrated by way of example and not limitation in the figures of the accompanying drawings in which:

FIG. 10A, FIG. 10B, and FIG. 10C illustrate embodiments of the invention.

DETAILED DESCRIPTION

Figure 1:
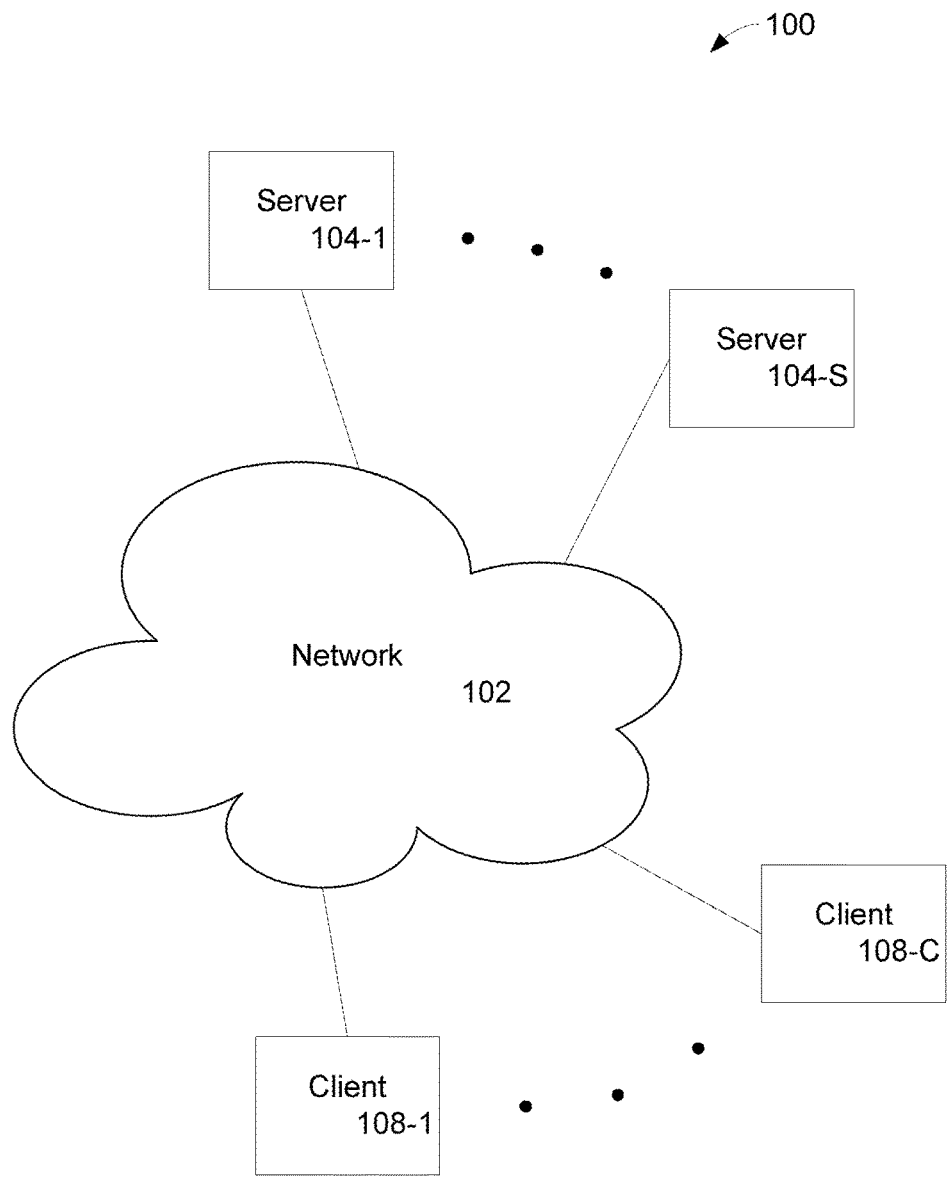
FIG. 1 illustrates a network environment in which the method and apparatus of the invention may be implemented.

One of skill in the art of Serializer/Deserializer (SERDES or SerDes) is familiar with such terms as CDR (clock data recovery), DFE (decision feedback equalization), VGA (variable gain amplifiers), PeakAmps (peaking amplifiers), PVT (process, voltage and temperature), EI (electrical idle), 8 b/10 b encoding, eye, data-eye, slicer, etc.

In one embodiment of the invention, adaptive equalization in the receiver is an effective way of performing equalization since it can detect channel loss and perform appropriate compensation to create an open eye at the input to the slicer in the receiver.

In one embodiment of the invention, two sets of slicers may be employed in the input path of the receiver. One set of slicers (main slicers) samples the input data after equalization has been applied to it while the other set of slicers (error slicers) samples the same input data but after a programmable error (e.g. in mV) has been subtracted from it. This allows the receiver to detect whether the input to the main slicer is greater than or less than a certain value. If the outputs of the error slicers match those of the main slicers then the input amplitude is greater than the error value applied. Such slicers may be employed in adaptive DFE techniques of the present invention and/or adaptive equalization techniques of the present invention.

In one embodiment of the invention, the input path in the receiver employs Variable Gain Amplifiers (VGAs), Peaking Amplifiers (PeakAmps) and DFE adders. PeakAmps are also referred to as Continuous Time Linear Equalizers (CTLE). The usage of VGAs and PeakAmps allows the adaptive equalization algorithm to independently adjust the DC and AC gains in the input path. In one embodiment of the invention, immediately after reset the DC and AC gains of the input paths are calibrated to zero to cancel out any variations due to Process, Voltage, and Temperature (PVT). DFE coefficients are set to zero as well. Offsets in differential amplifiers in the input path are cancelled as well (N.B. alternatively or in conjunction, offset cancellation can also be done dynamically at a later stage when input data is being received at the input of the receiver).

In one embodiment of the invention, adaptive equalization is based on techniques applied at the receiver, for example, at the receiver slicer the AC (high frequency—e.g. at bit rate) and DC amplitudes of the incoming signal are measured during an initial training process and this information is used to adjust AC and DC gains in the receiver path. In one embodiment of the invention, the goal of the equalization process is to realize substantially equal AC and DC input amplitudes at the input of the slicer.

In one embodiment of the invention, where the gain in the input path is zeroed out after reset the input signal levels seen by the slicers after reset represent the input signals seen at the inputs of the receiver pins (e.g. since the path between the pins and the slicers is a unity gain wide band path). Since most SERDES protocols employ training sequences prior to data transmission to allow the receivers to perform clock recovery, symbol alignment and inter-lane deskew (if applicable), the present invention can use known symbol patterns in these training sequences to perform adaptive equalization at that time.

In one embodiment of the invention, predetermined target eye opening required at the inputs of the slicers to reliably slice correct data may be used (e.g. simulations of the slicers may be used to determine the eye opening). This predetermined eye opening may be used by the techniques disclosed to determine whether adaptive equalization is complete or more adaptive equalization is needed.

In one embodiment of the invention, the first step in the adaptive equalization technique is to detect a clock pattern in the incoming data stream. Most protocols employ a clock pattern at half the data rate as the first training sequence pattern and this may be used by the adaptive equalization technique. If the amplitude of the clock pattern as seen by the slicer is smaller than the target amplitude (i.e. programmed to be greater than the minimum eye eight required by the slicer to allow for some margin beyond minimum slicer requirements) the AC gain in the input path is increased until the target amplitude is reached. The AC gain in the input path can be increased using the peaking amplifiers or using the DFE coefficients. If the channel is too lossy then it is possible that even the maximum AC gain in the input path will not result in a clock pattern amplitude greater than the required target. In such a case the AC gain is set at its maximum setting.

In one embodiment of the invention, the second step in the adaptive equalization technique is to detect a low frequency pattern in the incoming data stream (e.g. a sequence of consecutive ones or zeroes). In data patterns that are 8 b-10 b encoded the longest sequence of non-transitions is expected to be 5. So, a sequence of 4 consecutive ones or zeroes can be considered the low frequency portion of the pattern. Before channel equalization is complete it is possible that the CDR is not locked to the center of the incoming data eye. If so, then the sliced data may miss one of the bits in the low frequency pattern before the equalization process is complete. The amplitude of the final bit in this low frequency pattern is considered the low frequency amplitude of the input path. The DC gain in the input path is changed (e.g. increased or decreased) until the low frequency amplitude as seen by the slicers is just greater than the target amplitude (for example, in one embodiment the same as AC target amplitude). If the VGA gain or DFE coefficients are adjusted to achieve the target low frequency amplitude then the AC gain may be impacted during this process as well. In such a case the AC gain in the input path may be re-adjusted in order to achieve the AC amplitude target that was achieved in the first step. Care must be taken in an implementation to ensure that this process does not result in an endless loop where adjustment of low frequency gain impacts the AC gain and vice-versa.

In one embodiment of the invention, after the second step in the adaptive equalization technique the AC amplitude at the input of the slicer is substantially equal to the low frequency amplitude and the channel losses have been equalized. If the insertion loss profile of the channel does not have a monotonic slope then in one embodiment of the invention higher order DFE tap coefficients can be used to improve further on the input eye.

In one embodiment of the invention, the technique described above can be used to set error thresholds for electrical idle (EI) detection. Since the correct input amplitudes at the slicers after equalization are know, a fraction of this correct input amplitude can be used as an EI threshold. If the input levels fall below this EI threshold then it can be reliably concluded that the link has gone idle.

Figure 3:
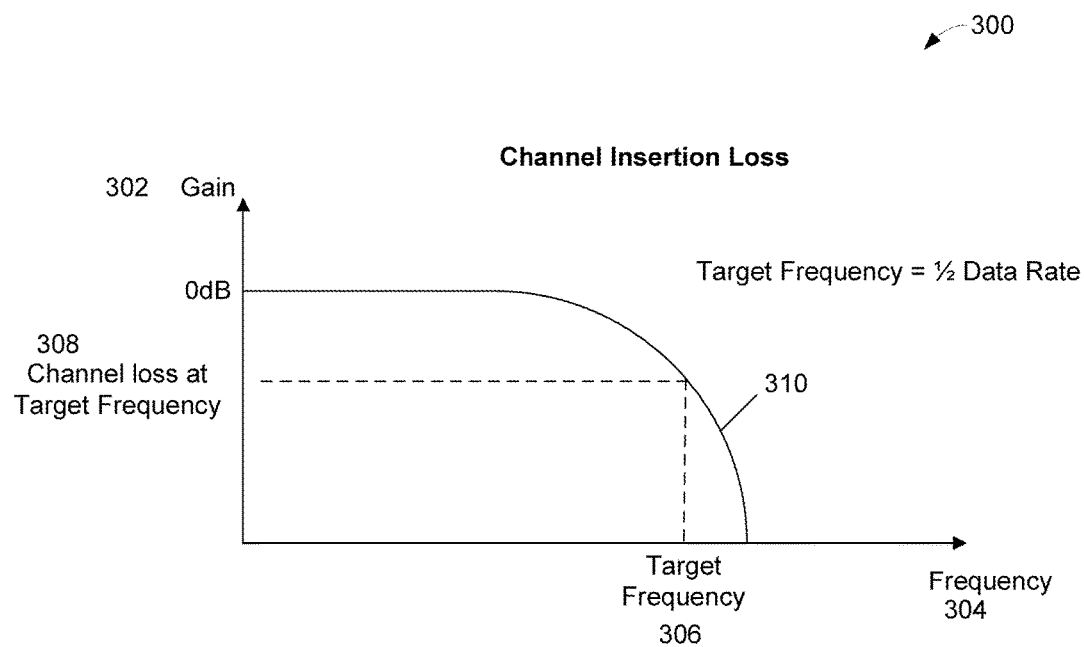
FIG. 3 illustrates an example channel insertion loss.

FIG. 3 illustrates, generally at 300, Channel Insertion Loss. At 302 is Gain, at 304 Frequency, at 306 Target Frequency, at 308 Channel loss at Target Frequency, and at 310 the Gain 302 versus Frequency 304 curve.

Figure 4:
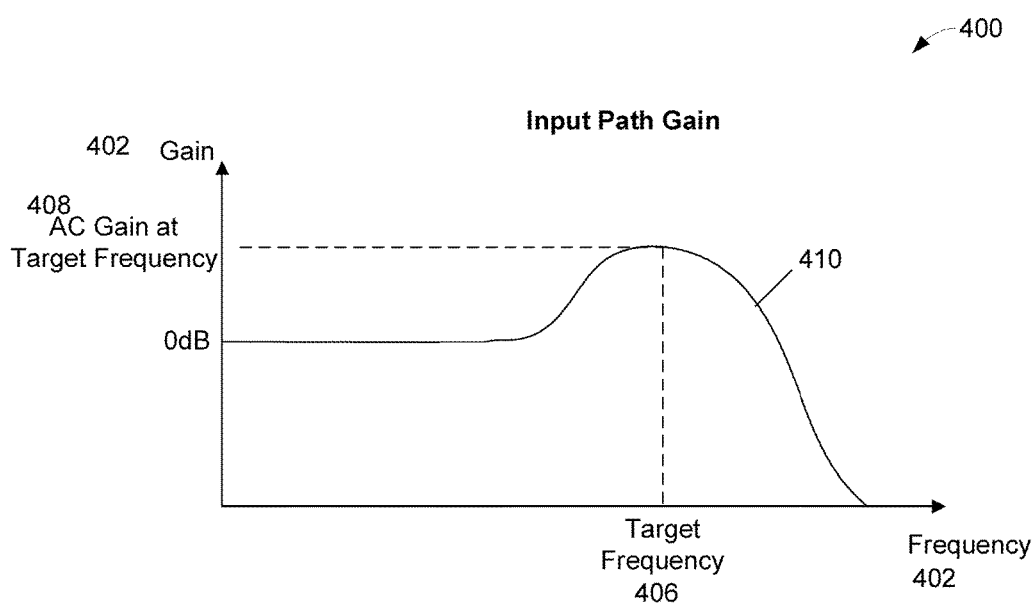
FIG. 4 illustrates one embodiment of the invention showing an input path gain.

FIG. 4 illustrates, generally at 400, one embodiment of the invention showing an Input Path Gain (such as that for a Channel Insertion Loss shown at FIG. 3). At 402 is Gain, at 404 Frequency, at 406 Target Frequency, at 408 AC Gain at Target Frequency, and at 410 the Gain 402 versus Frequency 404 curve. While a reference to 0 dB has been shown in FIG. 4, it is for illustrative purposes and does not represent any absolute gain values. That is the gain may be any value above and/or below 0 dB (e.g. 20 dB, 60 dB, −10 dB, −40 d , +60 dB to −60 dB, etc.)

In one embodiment of the invention, FIG. 3 shows an example of a channel insertion loss profile vs frequency and FIG. 4 the input gain profile that can be used to compensate for channel loss. The final gain vs frequency seen by the input slicers is the sum of the profiles in FIG. 3 and FIG. 4. In one embodiment of the invention, the goal of channel equalization is to realize a flat frequency response (but not necessarily 0 dB as shown in the figures) to at least the target frequency. The response at frequencies higher than the target frequency is determined by tradeoffs between desired eye opening and SNR (signal to noise ratio) concerns (e.g. wider bandwidth results in higher noise injection but also results in better input slew rates).

In one embodiment of the invention, consider a not uncommon long channel scenario where the transmitter drives a high amplitude into a very lossy channel (say for example, 800 mV into a 24 dB loss channel). The AC amplitude seen by the receiver will be attenuated by the channel loss at the target frequency (AC amplitude will be approximately 50 mV-800 mV attenuated by 24 dB). Hence, the AC gain in the input path is increased until the AC amplitude at the input of the receiver is greater than target amplitude (say for example, 200 mV—then the AC gain needed is 12 dB). However, a large DC amplitude is not desirable either (due to linearity concerns of analog circuits and due to large AC gains needed when DC gain is left at 0 dB). So, the technique described above would reduce the low frequency gain (to say −12 dB) such that the DC amplitude seen by the receiver matches the AC amplitude and thus the channel is equalized. Notice that the amount of equalization is 24 dB (DC gain=−12 dB, AC gain=+12 dB) but the final amplitudes at the inputs of the slicers may be smaller than at the output of the transmitters. Other channel loss cases combined with various transmitter amplitudes are also handled by the techniques describe above (for example, small transmit amplitude into a loss channel, large transmit amplitude into a short no-loss channel, etc.).

Figure 5:
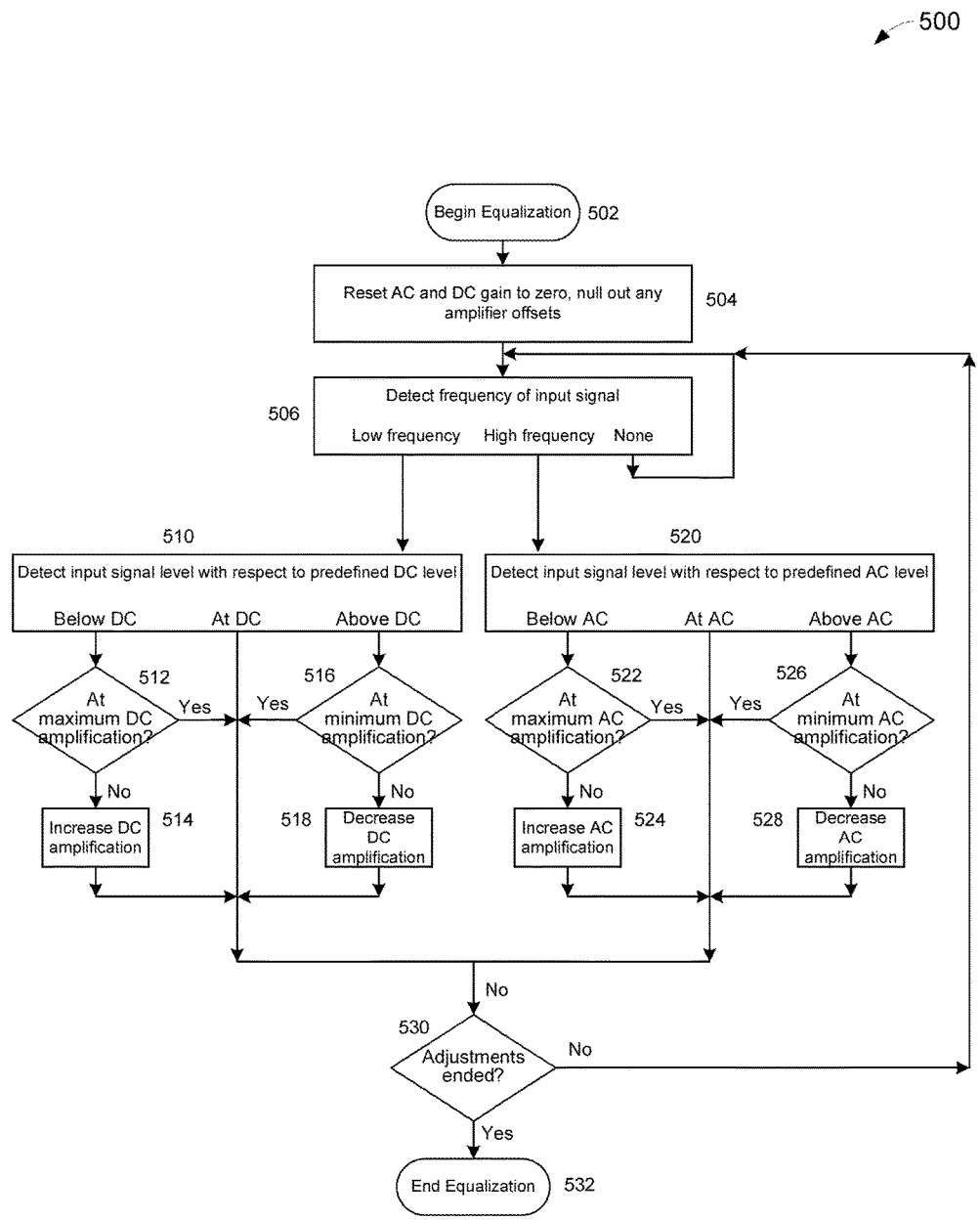
FIG. 5 illustrates one embodiment of the invention in flow chart form.

FIG. 5 illustrates, generally at 500, one embodiment of the invention showing an equalization sequence for a receiver where only AC and DC gains are adjusted. At 502 Begin Equalization. Equalization may begin based on any number of factors, for example, but not limited to power up, reset, time interval, under software control, under hardware, or may be based on factors such a errors encountered that suggest a new equalization is needed, etc. At 504 Reset AC and DC gain to zero, null out any amplifier offsets. Resetting AC and DC gain to zero and nulling out any amplifier offsets may be done in hardware and/or software. At 506 Detect frequency of input signal, Low frequency, High frequency, None. At 506 the input signal frequency is determined to be high, low, or none. None may be above a high preset limit, below a low preset limit, or none which may be indicative of no signal input or a DC level type input. At 506 if the input signal frequency is determined to be Low frequency then we proceed to 510. At 506 if the input signal frequency is determined to be High frequency then we proceed to 520. At 506 if the input signal frequency is determined to be None then we proceed loop back to 506 to Detect frequency of input signal again as the input signal varies over time. At 510 Detect input signal level with respect to predefined DC level, Below DC, At DC, Above DC. At 510 the detection of the input signal level with respect to a predefined DC results in Below DC, At DC, or Above DC. Below DC, At DC, and Above DC are understood to be ranges of voltages. For example, but not limited to, At DC may be 50-100 mV, Below DC<50 mV, and Above DC>100 mV. If at 510 the input signal level is Below DC then proceed to 512, if At DC then proceed to 530, if Above DC then proceed to 516. At 512 At maximum DC amplification? At 512 if at maximum DC amplification then proceed to 530. At 512 if not at maximum DC amplification then proceed to 514 to increase DC amplification. 514 Increase DC amplification. From 514 proceed to 530. At 516 At minimum DC amplification? At 516 if at minimum DC amplification then proceed to 530. At 516 if not at minimum DC amplification then proceed to 518 to decrease DC amplification. 518 Decrease DC amplification. From 518 proceed to 530. At 520 Detect input signal level with respect to predefined AC level, Below AC, At AC, Above AC. At 520 the detection of the input signal level with respect to a predefined AC results in Below AC, At AC, or Above AC. Below AC, At AC, and Above AC are understood to be ranges of voltages. For example, but not limited to, At AC may be 1-2V, Below AC<1V, and Above AC>2V. If at 520 the input signal level is Below AC then proceed to 522, if At AC then proceed to 530, if Above AC then proceed to 526. At 522 At maximum AC amplification? At 522 if at maximum AC amplification then proceed to 530. At 522 if not at maximum AC amplification then proceed to 524 to increase AC amplification. 524 Increase AC amplification. From 524 proceed to 530. At 526 At minimum AC amplification? At 526 if at minimum AC amplification then proceed to 530. At 526 if not at minimum AC amplification then proceed to 528 to decrease DC amplification. 528 Decrease DC amplification. From 528 proceed to 530. At 530 Adjustments ended? If at 530 adjustments are ended then go to 532. 532 End Equalization. If adjustment are not ended at 530 then proceed to 506. At 530 the determination if adjustments are ended may be based on a variety of conditions, for example, but not limited to, a timed sequence, the end of a training signal sequence, determination that there have been a given number of iterations through block 506, that there have been a given number of iterations through block 510 and 520 and that 510 and 520 have not changed amplification in a while and are At DC and At AC indicating no further adjustments in AC or DC amplification are needed, determination under hardware and/or software control, etc.

Figure 6:
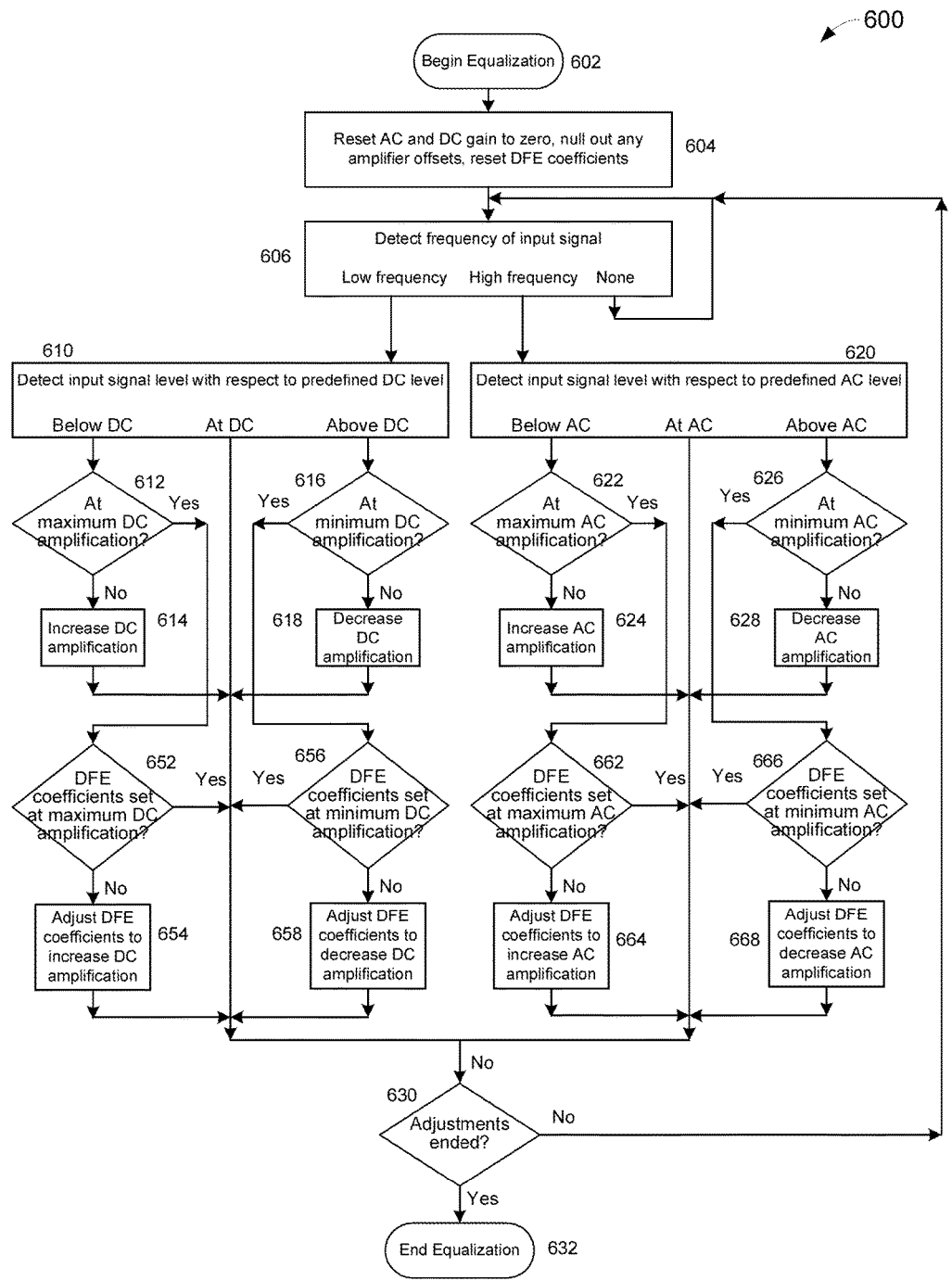
FIG. 6 illustrates one embodiment of the invention in flow chart form.

FIG. 6 illustrates, generally at 600, one embodiment of the invention showing an equalization sequence for a receiver where AC and DC gains are adjusted as well as DFE coefficients. As one of skill in the art is aware DFE coefficients are used to adjust adaptive filters. As one of skill in the art is aware there are a myriad of adaptive filter types (e.g. linear, FIR (finite impulse response), IIR (infinite impulse response), etc.) which may be used but are not germane to the invention other than the adjustment of the coefficients which are illustrated and describes. At 602 Begin Equalization. Equalization may begin based on any number of factors, for example, but not limited to power up, reset, time interval, under software control, under hardware, or may be based on factors such a errors encountered that suggest a new equalization is needed, break in a communication link, etc. At 604 Reset AC and DC gain to zero, null out any amplifier offsets, reset DFE coefficients. Resetting AC and DC gain to zero and nulling out any amplifier offsets may be done in hardware and/or software as may the resetting of the DFE coefficients either to some "zeroed" value or some preset value. At 606 Detect frequency of input signal, Low frequency, High frequency, None. At 606 the input signal frequency is determined to be high, low, or none. None may be above a high preset limit, below a low preset limit, or none which may be indicative of no signal input or a DC level type input. At 606 if the input signal frequency is determined to be Low frequency then we proceed to 610. At 606 if the input signal frequency is determined to be High frequency then we proceed to 620. At 606 if the input signal frequency is determined to be None then we proceed loop back to 606 to Detect frequency of input signal again as the input signal varies over time. At 610 Detect input signal level with respect to predefined DC level, Below DC, At DC, Above DC. At 610 the detection of the input signal level with respect to a predefined DC results in Below DC, At DC, or Above DC. Below DC, At DC, and Above DC are understood to be ranges of voltages. For example, but not limited to, At DC may be 500-1000 mV, Below DC<500 mV, and Above DC>1000 mV. If at 610 the input signal level is Below DC then proceed to 612, if At DC then proceed to 630, if Above DC then proceed to 616. At 612 At maximum DC amplification? At 612 if at maximum DC amplification then proceed to 652. At 612 if not at maximum DC amplification then proceed to 614 to increase DC amplification. 614 Increase DC amplification. From 614 proceed to 630. At 616 At minimum DC amplification? At 616 if at minimum DC amplification then proceed to 656. At 616 if not at minimum DC amplification then proceed to 618 to decrease DC amplification. 618 Decrease DC amplification. From 618 proceed to 630. At 620 Detect input signal level with respect to predefined AC level, Below AC, At AC, Above AC. At 620 the detection of the input signal level with respect to a predefined AC results in Below AC, At AC, or Above AC. Below AC, At AC, and Above AC are understood to be ranges of voltages. For example, but not limited to, At AC may be 500-1000 mV, Below AC<500 mV, and Above AC>1000 mV. If at 620 the input signal level is Below AC then proceed to 622, if At AC then proceed to 630, if Above AC then proceed to 626. At 622 At maximum AC amplification? At 622 if at maximum AC amplification then proceed to 662. At 622 if not at maximum AC amplification then proceed to 624 to increase AC amplification. 624 Increase AC amplification. From 624 proceed to 630. At 626 At minimum AC amplification? At 626 if at minimum AC amplification then proceed to 666. At 626 if not at minimum AC amplification then proceed to 628 to decrease DC amplification. 628 Decrease DC amplification. From 628 proceed to 630. At 652 DFE coefficients set at maximum DC amplification? At 652 if the DFE coefficients are set to achieve maximum DC amplification then proceed to 630. If the DFE coefficients are not set to achieve maximum DC amplification then proceed to 654. At 654 Adjust DFE coefficients to increase DC amplification. After adjusting the DFE coefficients to increase DC amplification at 654 proceed to 630. At 656 DFE coefficients set at minimum DC amplification? At 656 if the DFE coefficients are set to achieve minimum DC amplification then proceed to 630. If the DFE coefficients are not set to achieve minimum DC amplification then proceed to 658. At 658 Adjust DFE coefficients to decrease DC amplification. After adjusting the DFE coefficients to decrease DC amplification at 658 proceed to 630. At 662 DFE coefficients set at maximum AC amplification? At 662 if the DFE coefficients are set to achieve maximum AC amplification then proceed to 630. If the DFE coefficients are not set to achieve maximum AC amplification then proceed to 664. At 664 Adjust DFE coefficients to increase AC amplification. After adjusting the DFE coefficients to increase AC amplification at 664 proceed to 630. At 666 DFE coefficients set at minimum AC amplification? At 666 if the DFE coefficients are set to achieve minimum AC amplification then proceed to 630. If the DFE coefficients are not set to achieve minimum AC amplification then proceed to 668. At 668 Adjust DFE coefficients to decrease AC amplification. After adjusting the DFE coefficients to decrease AC amplification at 668 proceed to 630. At 630 Adjustments ended? If at 630 adjustments are ended then go to 632. 632 End Equalization. If adjustment are not ended at 630 then proceed to 606. At 630 the determination if adjustments are ended may be based on a variety of conditions, for example, but not limited to, a timed sequence, the end of a training signal sequence, determination that there have been a given number of iterations through block 606, that there have been a given number of iterations through block 610 and 620 and that 610 and 620 have not changed amplification in a while and are At DC and At AC indicating no further adjustments in AC or DC amplification are needed, determination under hardware and/or software control, etc.

While FIG. 6 illustrates the approach where DFE coefficients are invoked only if at DC or AC minimum or maximum amplification, the invention is not so limited. For example DFE may be used before any AC amplification, before any DC amplification, or before any AC and DC amplification. For example, adjusting DFE coefficients use may start when AC and/or DC gains are at about half their maximum value. In this way AC and DC gains and DFE coefficients may be adjusted before any approach hits its minimum or maximum values.

Figure 7:
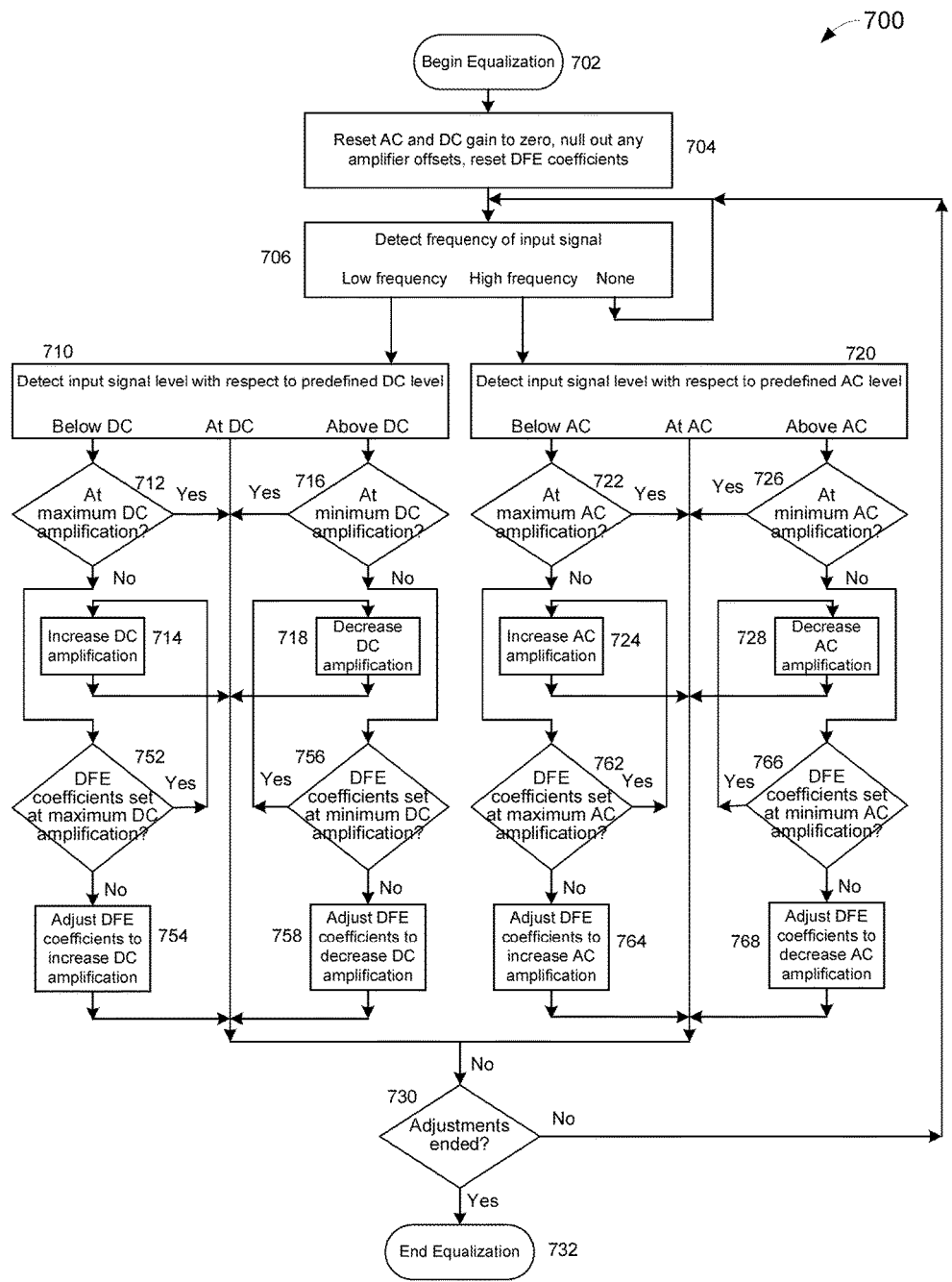
FIG. 7 illustrates one embodiment of the invention in flow chart form.

For example, FIG. 7 is similar to FIG. 6, however in FIG. 7 DFE adjustments are made when a gain limit is not hit.

FIG. 7 illustrates, generally at 700, one embodiment of the invention showing an equalization sequence for a receiver where AC and DC gains are adjusted as well as DFE coefficients. As one of skill in the art is aware DFE coefficients are used to adjust adaptive filters. As one of skill in the art is aware there are a myriad of adaptive filter types (e.g. linear, FIR (finite impulse response), IIR (infinite impulse response), etc.) which may be used but are not germane to the invention other than the adjustment of the coefficients which are illustrated and describes. At 702 Begin Equalization. Equalization may begin based on any number of factors, for example, but not limited to power up, reset, time interval, under software control, under hardware, or may be based on factors such a errors encountered that suggest a new equalization is needed, break in a communication link, etc. At 704 Reset AC and DC gain to zero, null out any amplifier offsets, reset DFE coefficients. Resetting AC and DC gain to zero and nulling out any amplifier offsets may be done in hardware and/or software as may the resetting of the DFE coefficients either to some "zeroed" value or some preset value. At 706 Detect frequency of input signal, Low frequency, High frequency, None. At 706 the input signal frequency is determined to be high, low, or none. None may be above a high preset limit, below a low preset limit, or none which may be indicative of no signal input or a DC level type input. At 706 if the input signal frequency is determined to be Low frequency then we proceed to 710. At 706 if the input signal frequency is determined to be High frequency then we proceed to 720. At 706 if the input signal frequency is determined to be None then we proceed loop back to 706 to Detect frequency of input signal again as the input signal varies over time. At 710 Detect input signal level with respect to predefined DC level, Below DC, At DC, Above DC. At 710 the detection of the input signal level with respect to a predefined DC results in Below DC, At DC, or Above DC. Below DC, At DC, and Above DC are understood to be ranges of voltages. For example, but not limited to, At DC may be 500-1000 mV, Below DC<500 mV, and Above DC>1000 mV. If at 710 the input signal level is Below DC then proceed to 712, if At DC then proceed to 730, if Above DC then proceed to 716. At 712 At maximum DC amplification? At 712 if at maximum DC amplification then proceed to 730. At 712 if not at maximum DC amplification then proceed to 752. At 716 At minimum DC amplification? At 716 if at minimum DC amplification then proceed to 30. At 716 if not at minimum DC amplification then proceed to 756. At 720 Detect input signal level with respect to predefined AC level, Below AC, At AC, Above AC. At 720 the detection of the input signal level with respect to a predefined AC results in Below AC, At AC, or Above AC. Below AC, At AC, and Above AC are understood to be ranges of voltages. For example, but not limited to, At AC may be 750-1200 mV, Below AC<750 mV, and Above AC>1200 mV. If at 720 the input signal level is Below AC then proceed to 722, if At AC then proceed to 730, if Above AC then proceed to 726. At 722 At maximum AC amplification? At 722 if at maximum AC amplification then proceed to 730. At 722 if not at maximum AC amplification then proceed to 762. At 726 At minimum AC amplification? At 726 if at minimum AC amplification then proceed to 730. At 726 if not at minimum AC amplification then proceed to 766. At 752 DFE coefficients set at maximum DC amplification? At 752 if the DFE coefficients are set to achieve maximum DC amplification then proceed to 714 to increase DC amplification. 714 Increase DC amplification. From 714 proceed to 730. If the DFE coefficients are not set to achieve maximum DC amplification then proceed to 754. At 754 Adjust DFE coefficients to increase DC amplification. After adjusting the DFE coefficients to increase DC amplification at 754 proceed to 730. At 756 DFE coefficients set at minimum DC amplification? At 756 if the DFE coefficients are set to achieve minimum DC amplification then proceed to 718 to decrease DC amplification. 718 Decrease DC amplification. From 718 proceed to 730. If the DFE coefficients are not set to achieve minimum DC amplification then proceed to 758. At 758 Adjust DFE coefficients to decrease DC amplification. After adjusting the DFE coefficients to decrease DC amplification at 758 proceed to 730. At 762 DFE coefficients set at maximum AC amplification? At 762 if the DFE coefficients are set to achieve maximum AC amplification then proceed to 724 to increase AC amplification. 724 Increase AC amplification. From 724 proceed to 730. If the DFE coefficients are not set to achieve maximum AC amplification then proceed to 764. At 764 Adjust DFE coefficients to increase AC amplification. After adjusting the DFE coefficients to increase AC amplification at 764 proceed to 730. At 766 DFE coefficients set at minimum AC amplification? At 766 if the DFE coefficients are set to achieve minimum AC amplification then proceed to 728 to decrease DC amplification. 728 Decrease DC amplification. From 728 proceed to 730. If the DFE coefficients are not set to achieve minimum AC amplification then proceed to 768. At 768 Adjust DFE coefficients to decrease AC amplification. After adjusting the DFE coefficients to decrease AC amplification at 768 proceed to 730. At 730 Adjustments ended? If at 730 adjustments are ended then go to 732. 732 End Equalization. If adjustment are not ended at 730 then proceed to 706. At 730 the determination if adjustments are ended may be based on a variety of conditions, for example, but not limited to, a timed sequence, the end of a training signal sequence, determination that there have been a given number of iterations through block 706, that there have been a given number of iterations through block 710 and 720 and that 710 and 720 have not changed amplification in a while and are At DC and At AC indicating no further adjustments in AC or DC amplification are needed, determination under hardware and/or software control, etc.

Figure 8:
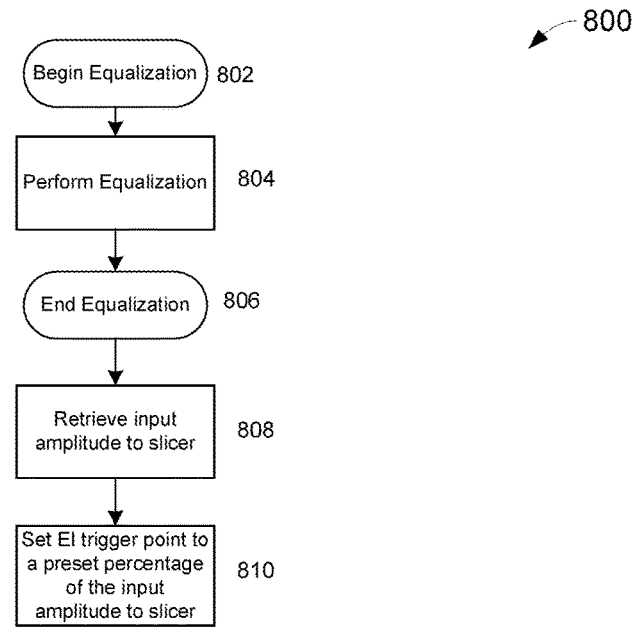
FIG. 8 illustrates one embodiment of the invention showing setting an electrical idle trigger point.

FIG. 8 illustrates, generally at 800, one embodiment of the invention showing setting electrical idle (EI) detection. At 802 Begin Equalization. At 804 Perform Equalization. At 806 End Equalization. At 808 Retrieve input amplitude to slicer. At 810 Set EI trigger point to a preset percentage of the input amplitude to slicer. The equalization performed at 804 may be any or a combination of any equalization techniques as described above. With the EI trigger point set at 810 any input below this trigger point will be considered in electrical idle.

In one embodiment of the invention the VGA may be a 16 bit amplifier, the Peaking Amp a 5 bit amplifier with a 10 bit DC gain, the DFE having 32 bit tap codes, and an error reference generator having 5 bit resolution.

In one embodiment of the invention during the equalization process (also called training) a search is made for consecutive-bit portion of a training pattern and either the VGA gain is increased to establish the signal level equivalent to the clock pattern or the DC gain is decreased to establish the signal level equivalent to the clock pattern.

In one embodiment of the invention during the equalization process an error reference generator is used to measure the slicer input at various conditions in order to make decisions on frontend control variables. For example, to measure the signal an error reference control is swept to the point where an error data indicator switches state (e.g. 0 to 1 or 1 to 0). Two types of measurements are made an AC measurement and a DC measurement. For an AC measurement a full-rate clock pattern is detected and measured (e.g. either a full clock pattern symbol or portions of a symbol can be matched). For a DC measurement consecutive 1 s or 0 s (ones or zeros) are matched to measure the amplitude of specific bits.

Figure 9:
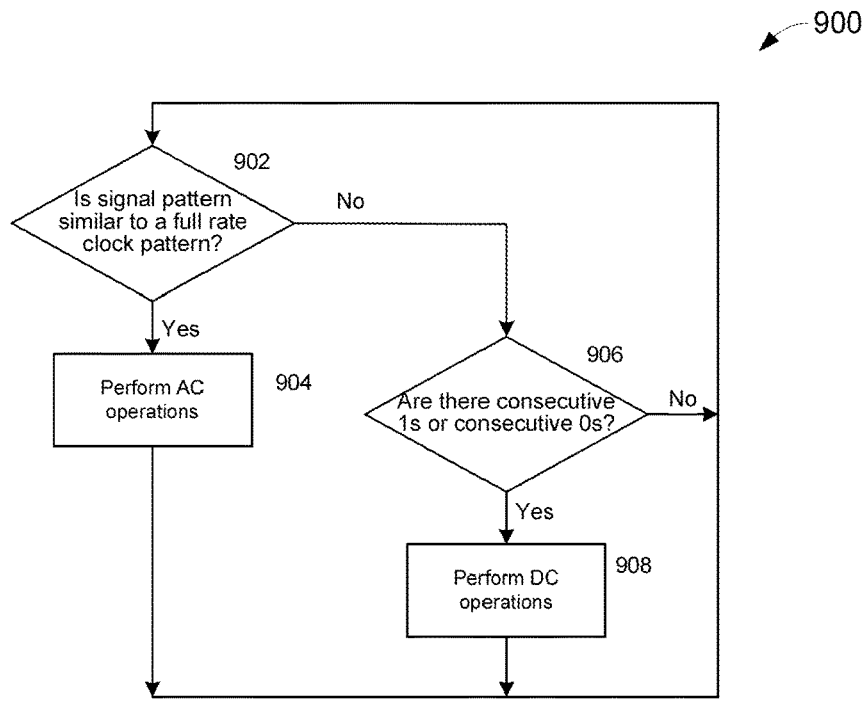
FIG. 9 illustrates one embodiment of the invention showing when AC and DC operations are performed.

FIG. 9 illustrates, generally at 900, one embodiment of the invention showing when AC and DC operations are performed. At 902 a check is made to see Is signal pattern similar to a full rate clock pattern? Similar in this case means having a similar number of signal transitions in a similar time period. This would represent the signal pattern having high frequency energy content (e.g. maximum transitions per time period). If the signal pattern is similar to a full rate clock pattern then at 904 Perform AC operations and then return to 902. If the signal pattern is not similar to a full rate clock pattern then at 906 a check is made to see are there consecutive 1 s or consecutive 0 s? If there are not consecutive 1 s or consecutive 0 s then proceed to 902. If there are consecutive 1 s or consecutive 0 s then at 908 Perform DC operations and then proceed to 902. Consecutive 1 s or consecutive 0 s will have less high frequency energy and more low frequency energy (i.e. more DC like energy, e.g. fewer than maximum transitions per time period). AC operations and DC operations are when AC and DC measurements and AC and DC adjustments would be performed. For example, to adjust AC gains, an AC measurement may be performed at 904 and as soon as the measurement is done at 904 an AC gain may be adjusted at 904. Similarly, at 908 to adjust DC gains, a DC measurement may be performed at 908 and as soon as the measurement is done at 908 a DC gain may be adjusted at 908. More than one cycle of measurement/adjustment may be done at 904 and 908.

In one embodiment of the invention detection of the AC portion of a signal versus a DC portion of the signal may be performed by looking at the signal transitions. For example, but not limited to, a high frequency would be a signal that transitions frequency for a given bit position relative to a clock, and a low frequency would be a signal that does not transition often relative to a clock. For example, but not limited to, a high frequency may be considered a signal that transitions as often as a clock, or 70 percent as often as a clock, etc.

In one embodiment of the invention detection of the AC portion of a signal versus a DC portion of the signal may be performed by comparing the signal to a clock. For example, but not limited to, a high frequency signal may be one that is within 50 percent of the frequency of a clock, whereas a low frequency signal may be one that is below 50 percent the frequency of a clock. In another embodiment the threshold may be 20-40 percent of a clock for low frequency, and 60-100 percent of a clock for high frequency.

As one of skill in the art is aware there are several ways to generate and use a clock for sampling of data. This sample clock may be derived/recovered from the data stream itself possibly using a PLL or similar device to upconvert or downconvert for sampling purposes. It may come from a central synchronized clock, etc. What is to be appreciated is that regardless of how the clock (sample clock) is derived it has a relationship to the data bits in a data stream and is used to clock or determine the bits in a data stream. As such when the data stream is conveying more information than less, there generally are more transitions and the transferred data rate is higher resulting in more high frequency content or energy as compared to less data being transferred per unit time in which case there are generally fewer transitions and a lower frequency or energy content as compared to more data being transferred per unit time.

Thus the sample clock (clock) can be used as a reference against which to compare an incoming data stream to determine if there is high or low frequency energy or content with respect to the clock. As understood by one of skill in the art the symbol duration time also known as the unit interval is the time between signal transitions. The unit interval may thus also be used to determine the frequency content of a data stream.

As one of skill in the art is aware, adjusting or modifying a frequency response can be done by amplification and/or attenuation. For example, a "DC gain" in a frequency response may be achieved by an actual DC amplification, or attenuating the AC response more than the DC thereby boosting the relative DC component as compared to the AC component. Alternatively both a DC amplification and an AC attenuation may be used. This also applies to any frequency range. Adjusting AC gains, adjusting DC gains, and adjusting DFE coefficients are hereby explicitly declared to be actual amplifications and/or attenuations that result in the modification of the frequency spectrum in the intended manner with respect to the entire frequency spectrum. Thus, for example, adjusting an AC gain increases AC components by either actual amplification, or alternatively attenuation of DC, or alternatively actual amplification of AC and attenuation of DC. Likewise adjusting DFE coefficients may be used to provide emphasis or deemphasis to any part of a frequency spectrum.

FIG. 10A, FIG. 10B, FIG. 10C, FIG. 10D, FIG. 10E, and FIG. 10F illustrate, generally at 1000, embodiments of the invention.

At 1001 is shown one embodiment of the invention where a method for adaptive equalization of a serializer/deserializer (SERDES) link is described.

The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

At 1002 is shown one embodiment of the invention where a method for adaptive equalization of a serializer/deserializer (SERDES) link is described The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

At 1003 is shown one embodiment of the invention where a method for adaptive equalization of a serializer/deserializer (SERDES) link is described.

The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted. Where adjusting the DC gains is adjusting the DC gains until a DC limit is reached, the DC limit selected from a maximum DC gain, a minimum DC gain, or a predefined DC level for the signal.

At 1004 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain or a predefined AC level for the signal.

Where adjusting the DC gains is adjusting the DC gains until a DC limit is reached, the DC limit selected from a maximum DC gain, a minimum DC gain, or a predefined DC level for the signal.

At 1005 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the DC limit of maximum DC gain is reached.

At 1006 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the DC limit of minimum DC gain is reached.

At 1007 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a redefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the AC limit of maximum AC gain is reached.

At 1008 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the AC gain limit of minimum AC gain is reached.

At 1009 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the DC limit of maximum DC gain is reached.

Where adjusting one or more decision feedback equalization coefficients in the adaptive filter increases the signal low frequency energy.

At 1010 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the Serdes link at the receiver.

And when the frequency of the signal has high frequency energy then the AC gains are adjusted and when the frequency of the signal has low frequency enemy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the DC limit of minimum DC gain is reached.

Where adjusting one or more decision feedback equalization coefficients in the adaptive filter decreases the signal low frequency energy.

At 1011 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal. And further adjusting one or more decision feedback equalization coefficients in an adaptive filter when the AC limit of maximum AC gain is reached.

Where adjusting one or more decision feedback equalization coefficients in the adaptive filter increases the signal high frequency energy.

At 1012 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And further adjusting one or more decision feedback equalization coefficients in an adaptive filter when the AC gain limit of minimum AC gain is reached.

Where adjusting one or more decision feedback equalization coefficients in the adaptive filter decreases the signal high frequency energy.

At 1013 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted. Where adjusting the AC gains is adjusting the AC gains until an AC limit is reached, the AC limit selected from a maximum AC gain, a minimum AC gain, or a predefined AC level for the signal. Where adjusting the DC gains is adjusting the DC gains until a DC limit is reached, the DC limit selected from a maximum DC gain, a minimum DC gain, or a predefined DC level for the signal. And when the predefined AC level for the signal is reached and when the predefined DC level for the signal is reached no further adjusting of the AC gains is performed and no further adjusting of the DC gains is performed.

At 1014 is shown one embodiment of the invention where a method for adaptive equalization of a serializer/deserializer (SERDES) link is described. The AC gains are reset to zero for a receiver coupled to the SERDES link.

The DC gains are reset to zero for the receiver coupled to the SERDES link.

A frequency of a signal is detected on the SERDES link at the receiver.

And when the frequency of the signal has high frequency energy then the AC gains are adjusted and when the frequency of the signal has low frequency energy the DC gains are adjusted.

Where adjusting the AC gains is adjusting the AC gains until an AC limit is reached, the AC limit selected from a maximum AC gain, a minimum AC gain, or a predefined AC level for the signal.

Where adjusting the DC gains is adjusting the DC gains until a DC limit is reached, the DC limit selected from a maximum DC gain, a minimum DC gain, or a predefined DC level for the signal.

And when the predefined AC level for the signal is reached and when the redefined DC level for the signal is reached no further adjusting of the AC gains is performed and no further adjusting of the DC gains is performed.

Where when no further adjusting of the AC gains is performed and no further adjusting of the DC gains is performed then adjusting an electrical idle signal threshold to a first predefined percentage of the predefined AC level for the signal and a second predefined percentage of the predefined DC level for the signal.

At 1015 is shown one embodiment of the invention described as an apparatus having:
  means for resetting AC and DC gains in a receiver to zero;
  means for resetting decision feedback equalization (DFE) coefficients in an adaptive filter;
  means for detecting a frequency of a signal at the receiver;
  means for adjusting the signal at the receiver to a predefined AC level by adjusting the AC gains and adjusting the DFE coefficients when the detected frequency in the signal is within 50 percent of a frequency of a clock; and
  means for adjusting the signal at the receiver to a predefined DC level by adjusting the DC gains and adjusting the DFE coefficients when the detected frequency in the signal is below 50 percent of the frequency of the clock.

At 1016 is shown one embodiment of the invention described as an apparatus having: means for resetting AC and DC gains in a receiver to zero; means for resetting decision feedback equalization (DFE) coefficients in an adaptive filter; means for detecting a frequency of a signal at the receiver; means for adjusting the signal at the receiver to a detected frequency in the signal is within 50 percent of a frequency of a clock; and means for adjusting the signal at the receiver to a predefined DC level by adjusting the DC gains and adjusting the DFE coefficients when the detected frequency in the signal is below 50 percent of the frequency of the clock. And where the AC gains have a range from zero AC gain to a maximum AC gain, and where the DC gains have a range from zero DC gain to a maximum DC gain, and where the adjusting the DFE coefficients occurs only when a limit is hit, the limit selected from the maximum AC gain, or the maximum DC gain.

At 1017 is shown one embodiment of the invention described as an apparatus having means for resetting AC and DC gains in a receiver to zero; means for resetting decision feedback equalization (DFE) coefficients in an adaptive filter; means for detecting a frequency of a signal at the receiver; means for adjusting the signal at the receiver to a predefined AC level by adjusting the AC gains and adjusting the DFE coefficients when the detected frequency in the signal is within 50 percent of a frequency of a clock; and means for adjusting the signal at the receiver to a predefined DC level by adjusting the DC gains and adjusting the DFE coefficients when the detected frequency in the signal is below 50 percent of the frequency of the clock. Where the AC gains have a range from zero AC gain to a maximum AC gain, and where the DC gains have a range from zero DC gain to a maximum DC gain, and where the adjusting the DFE coefficients occurs only when a limit is not hit, the limit selected from the maximum AC gain, or the maximum DC gain.

At 1018 is shown one embodiment of the invention where a method is described.
(a) receiving at a serializer/deserializer receiver input a training signal pattern having a sequence of alternating bits and a sequence of three or more consecutive same bits;
(b) adjusting AC gains when the training signal pattern having the sequence of alternating bits is present until the training signal pattern is at a predefined AC signal level;
(c) adjusting DC gains when the training signal pattern having the sequence of three or more consecutive same bits is present until the training signal pattern is at a predefined DC signal level; and
(d) repeating sequence (b)-(c) until the training signal pattern ends.

At 1019 is shown one embodiment of the invention where a method is described.
(a) receiving at a serializer/deserializer receiver input a training signal pattern having a sequence of alternating bits and a sequence of three or more consecutive same bits;
(b) adjusting AC gains when the training signal pattern having the sequence of alternating bits is present until the training signal pattern is at a predefined AC signal level;
(c) adjusting DC gains when the training signal pattern having the sequence of three or more consecutive same bits is present until the training signal pattern is at a predefined DC signal level;
(d) repeating sequence (b)-(c) until the training signal pattern ends;
(e) adjusting decision feedback equalization coefficients in an adaptive filter.

At 1020 is shown one embodiment of the invention where a method is described.
(a) receiving at a serializer/deserializer receiver input a training signal pattern having a sequence of alternating bits and a sequence of three or more consecutive same bits;
(b) adjusting AC gains when the training signal pattern having the sequence of alternating bits is present until the training signal pattern is at a predefined AC signal level;
(c) adjusting DC gains when the training signal pattern having the sequence of three or more consecutive same bits is present until the training signal pattern is at a predefined DC signal level;

(d) repeating sequence (b)-(c) until the training signal pattern ends; and then (e) adjusting an electrical idle signal threshold to a predefined percentage of the predefined AC signal level and the predefined DC signal level.

At 1021 is shown one embodiment of the invention described as an apparatus having: means for resetting AC and DC gains in a receiver to zero; means for resetting decision feedback equalization (DFE) coefficients in an adaptive filter; means for detecting a frequency of a signal at the receiver; means for adjusting the signal at the receiver to a predefined AC level by adjusting the AC gains and adjusting the DFE coefficients when the detected frequency in the signal is within 50 percent of a frequency of a clock; and means for adjusting the signal at the receiver to a predefined DC level by adjusting the DC gains and adjusting the DFE coefficients when the detected frequency in the signal is below 50 percent of the frequency of the clock. Where the clock is substantially one-half a data rate of the signal.

Thus a method and apparatus for novel adaptive equalization technique for Serializer/Deserializer links have been described.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
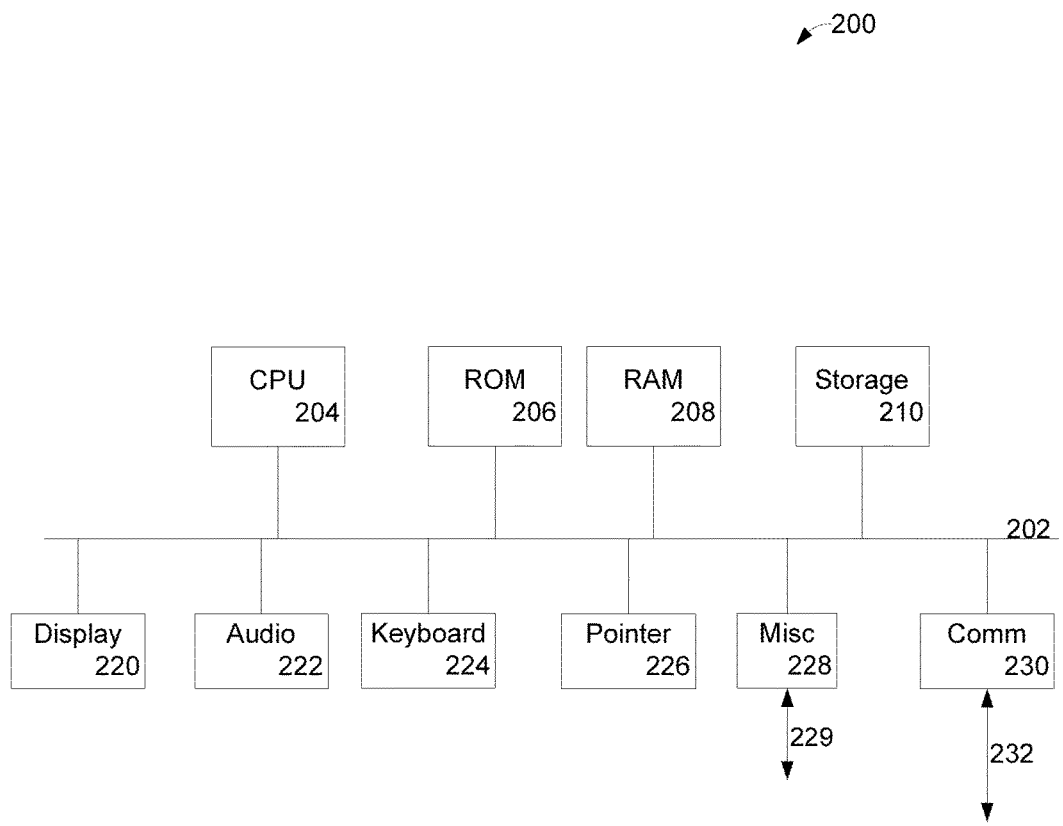
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, I/O link 229, communications 230, and communications link 232. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any physical mechanism for storing or transmitting information in a form readable by a machine (e.g., a computer). For example, a machine-readable medium includes read only memory (ROM); random access memory (RAM); magnetic disk storage media; optical storage media; flash memory devices; electrons on a floating gate; electrical, optical, acoustical or other form of propagated signals which upon reception causes physical movement in physical matter (e.g. electrons, atoms, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as ""substantially equal" is used to indicate that they are for all practical purposes equal.

It is to be understood that in any one or more embodiments of the invention where alternative approaches or techniques are discussed that any and all such combinations as might be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for novel adaptive equalization technique for Serializer/Deserializer links have been described.

What is claimed is:

1. A method comprising:
   (a) resetting AC gains to zero for a serializer/deserializer receiver, said serializer/deserializer receiver having an input;
   (b) resetting DC gains to zero for said serializer/deserializer receiver;
   (c) receiving at said serializer/deserializer receiver input a training signal pattern having a sequence of alternating bits and a sequence of three or more consecutive same bits;
   (d) adjusting said AC gains when said training signal pattern having said sequence of alternating bits is present until said training signal pattern is at a predefined AC signal level;
   (e) adjusting said DC gains when said training signal pattern having said sequence of three or more consecutive same bits is present until said training signal pattern is at a predefined DC signal level;

(f) repeating sequence (d)-(e) until said training signal pattern ends.

2. The method of claim 1 further comprising:

(g) adjusting decision feedback equalization coefficients in an adaptive filter.

3. The method of claim 1 further comprising:

(g) adjusting an electrical idle signal threshold to a predefined percentage of said predefined AC signal level and said predefined DC signal level.

\* \* \* \* \*